(12) United States Patent
Shih et al.

(10) Patent No.: US 12,309,970 B2
(45) Date of Patent: May 20, 2025

(54) WATER COOLING RADIATOR

(71) Applicant: MICRO-STAR INT'L CO, LTD., New Taipei (TW)

(72) Inventors: Shun-yu Shih, Taipei (TW); Tsung-wei Lin, Taipei (TW)

(73) Assignee: MICRO-STAR INT'L CO, LTD., New Taipei (TW)

( * ) Notice: Subject to any disclaimer, the term of this patent is extended or adjusted under 35 U.S.C. 154(b) by 278 days.

(21) Appl. No.: 18/094,425

(22) Filed: Jan. 9, 2023

(65) Prior Publication Data

US 2023/0232577 A1    Jul. 20, 2023

(30) Foreign Application Priority Data

Jan. 18, 2022  (TW) ................................ 111200661

(51) Int. Cl.
*H05K 7/20* (2006.01)
*G06F 1/20* (2006.01)

(52) U.S. Cl.
CPC ......... *H05K 7/20263* (2013.01); *G06F 1/206* (2013.01); *H05K 7/20272* (2013.01)

(58) Field of Classification Search
CPC . H05K 7/20263; H05K 7/20272; G06F 1/206
USPC ...................................................... 165/143
See application file for complete search history.

(56) References Cited

U.S. PATENT DOCUMENTS

| | | | | |
|---|---|---|---|---|
| 6,170,565 B1 * | 1/2001 | Nishishita | ............. | F28D 1/0435 165/146 |
| 6,189,604 B1 * | 2/2001 | Yamauchi | ........... | F28D 1/05375 165/145 |
| 6,374,632 B1 * | 4/2002 | Nobuta | .................... | F25B 39/04 62/509 |
| 6,408,939 B1 * | 6/2002 | Sugimoto | ............... | F28F 1/128 165/149 |
| 6,561,264 B2 * | 5/2003 | Ozaki | .................... | F28D 1/0435 165/135 |
| 7,096,932 B2 * | 8/2006 | Scoville | ................ | F28F 9/0202 165/135 |
| 7,360,584 B2 * | 4/2008 | Hunzinger | ............. | F28D 1/0443 165/81 |
| 7,506,683 B2 * | 3/2009 | Hu | ........................ | F28D 1/0443 165/151 |
| 8,397,797 B2 * | 3/2013 | Piggott | ..................... | F28F 9/02 165/81 |
| 9,062,919 B2 * | 6/2015 | Hanafusa | .............. | F28F 9/0209 |

(Continued)

*Primary Examiner* — Claire E Rojohn, III
(74) *Attorney, Agent, or Firm* — Maschoff Brennan

(57) ABSTRACT

A water cooling radiator includes a first radiator having a liquid tank, first liquid return tank, first inlet radiator portion, and first outlet radiator portion. The first inlet radiator portion is adjacent to the first outlet radiator portion and both are between the liquid tank and first liquid return tank. The first inlet radiator portion includes at least one first inlet pipe thermally coupled to at least one first inlet heat dissipating fin. The first outlet radiator portion includes at least one first outlet pipe thermally coupled to at least one first outlet heat dissipating fin. A first inlet temperature of a liquid coolant at a first inlet fluid input end is greater than a first return temperature of the liquid coolant at a first outlet fluid input end. A pitch measurement of a first inlet fin pitch is greater than a pitch measurement of a first outlet fin pitch.

18 Claims, 4 Drawing Sheets

(56) References Cited

U.S. PATENT DOCUMENTS

| | | | | |
|---|---|---|---|---|
| 9,671,176 | B2* | 6/2017 | Johnson | F28D 1/0435 |
| 9,709,344 | B2* | 7/2017 | Brümmer | F28D 1/05375 |
| 9,795,064 | B2* | 10/2017 | Aoki | H05K 7/20772 |
| 10,041,710 | B2* | 8/2018 | Morimoto | F28F 27/02 |
| 10,222,136 | B2* | 3/2019 | Hoffmann | F28F 13/14 |
| 10,533,769 | B2* | 1/2020 | Volkmann | F28F 1/40 |
| 11,199,365 | B2* | 12/2021 | Elder | F28F 3/025 |
| 11,549,763 | B2* | 1/2023 | Mitsuhashi | F28F 11/00 |
| 2005/0006068 | A1* | 1/2005 | Desai | F28F 9/0202 165/173 |
| 2005/0133207 | A1* | 6/2005 | Scoville | F28D 1/0443 165/140 |
| 2007/0137841 | A1* | 6/2007 | Bjork | F28F 1/126 165/906 |
| 2007/0175610 | A1* | 8/2007 | Yeh | H01L 23/473 257/E23.098 |
| 2010/0108042 | A1* | 5/2010 | Akiyoshi | F28F 3/025 29/890.03 |
| 2010/0181058 | A1* | 7/2010 | Huazhao | F28D 1/05383 165/173 |
| 2011/0186277 | A1* | 8/2011 | Hanafusa | F28F 9/02 165/173 |
| 2011/0253354 | A1* | 10/2011 | Suzuki | F28F 9/0243 165/173 |
| 2012/0102974 | A1* | 5/2012 | Kawazoe | F28D 1/0417 62/3.61 |
| 2012/0241137 | A1* | 9/2012 | Aoki | F28D 1/0476 165/143 |
| 2013/0213624 | A1* | 8/2013 | Fujii | F28F 1/126 165/172 |
| 2013/0248150 | A1* | 9/2013 | Ninagawa | F28F 1/325 165/104.19 |
| 2013/0292098 | A1* | 11/2013 | Jindou | F28F 17/005 165/151 |
| 2014/0174424 | A1* | 6/2014 | Chen | F28F 13/08 165/157 |
| 2015/0083377 | A1* | 3/2015 | Jindou | F28D 1/0443 165/143 |
| 2015/0096311 | A1* | 4/2015 | Johnson | F25B 39/00 62/89 |
| 2016/0138871 | A1* | 5/2016 | Matsumoto | F28F 9/028 62/526 |
| 2016/0153727 | A1* | 6/2016 | Nakamura | F28F 3/027 165/109.1 |
| 2017/0245357 | A1* | 8/2017 | Shih | G06F 1/20 |
| 2017/0257979 | A1* | 9/2017 | Wu | H01L 23/473 |
| 2019/0364694 | A1* | 11/2019 | Lin | H01L 23/473 |
| 2021/0048256 | A1* | 2/2021 | Xiao | F28F 9/0202 |
| 2022/0030746 | A1* | 1/2022 | Shih | H05K 7/20272 |
| 2022/0087063 | A1* | 3/2022 | Shih | G06F 1/20 |
| 2023/0189425 | A1* | 6/2023 | Shih | H05K 1/0203 361/679.46 |
| 2023/0232577 | A1* | 7/2023 | Shih | G06F 1/206 165/143 |

* cited by examiner

WATER COOLING RADIATOR

CROSS-REFERENCE TO RELATED APPLICATIONS

This US application claims the benefit of priority to Taiwan Application No. 111200661, filed on Jan. 18, 2022, the disclosure of which is incorporated by reference herein in its entirety.

TECHNICAL FIELD

Example embodiments relate to heat dissipation using fluid and, more particularly, to water cooling radiators using a circulating cooling fluid that dissipates heat generated by processing units (e.g., CPUs, GPUs, etc.) used in a computer.

BACKGROUND

With the increase of the processing speed and performance of electronic components, such as central processing units (CPUs), the amount of heat generated during operation of the electronic component increases. The heat generation increases the temperature of the electronic component and, if the heat cannot be dissipated effectively, reliability and performance of the electronic component are reduced. To prevent overheating of an electronic component, typically, a water cooling system is used for cooling the electronic component and, thereby maintaining normal operation of the electronic component.

Existing water cooling systems typically include a base plate of a heat exchange chamber attached to a CPU, and the heat exchange chamber is fluidly connected to a fluid circulating pump and a radiator. The pump circulates the fluid inside the heat exchange chamber in order to deliver the fluid at lower temperature to the heat exchange chamber. As the fluid circulates in the heat exchange chamber, thermal energy is exchanged between the base plate and the fluid, and, as a result, the temperature of the base plate is reduced and the temperature of the fluid increases. As the fluid circulates in tubes and fins of the radiator, thermal energy is exchanged between the fluid and the tubes and fins, and, as a result, the temperature of the fluid is reduced and the temperature of the tubes and fins increases. The thermal energy is dissipated to ambient air when the temperature of the ambient air is cooler than the tubes and/or fins. Thus, radiators play and important role in the heat transfer efficiency of water cooling systems. However, there are often trade-offs when selecting a particular radiator. Each larger sized radiator is measured by the addition of one or more fans, thus, generally, sacrificing available space, cost budget, and a quieter system, for increased cooling capacity. Meanwhile, for same sized radiators, increased fin density (or decreased fin pitch), generally, sacrifices cost budget, and a quieter system, for increased cooling capacity. Furthermore, for same sized radiators having same fin densities, while a thicker radiator will increase total fin surface area, generally, cost budget, and a quieter system are sacrifices, for increased cooling capacity.

SUMMARY

Various aspects of the present disclosure provide a water cooling radiator for dissipating heat generated by electronic components.

According to one aspect of the present disclosure, a water cooling radiator, configured for liquid coolant to flow therethrough, includes a first radiator having a first radiator thickness. The first radiator includes a liquid tank, a first liquid return tank, a first inlet radiator portion, and a first outlet radiator portion. The liquid tank includes an inlet chamber, an outlet chamber, and a first dividing panel. The inlet chamber has an inlet port, the outlet chamber has an outlet port. The first dividing panel separates the inlet chamber from the outlet chamber. The first liquid return tank defines a first return chamber. The first inlet radiator portion is disposed between the liquid tank and the first liquid return tank. The first inlet radiator portion includes at least one first inlet heat dissipating fin and at least one first inlet pipe. The at least one first inlet heat dissipating fin has a first inlet fin pitch. The at least one first inlet pipe is in fluid communication with the inlet chamber via a first inlet fluid input end and in fluid communication with the first return chamber via a first inlet fluid output end. The at least one first inlet pipe is thermally coupled to the at least one first inlet heat dissipating fin. The first outlet radiator portion is disposed between the liquid tank and the first liquid return tank and adjacent to the first inlet radiator portion. The first outlet radiator portion includes at least one first outlet heat dissipating fin and at least one first outlet pipe. The at least one first outlet heat dissipating fin has a first outlet fin pitch. The at least one first outlet pipe in fluid communication with the first return chamber via a first outlet fluid input end and in fluid communication with the outlet chamber via a first outlet fluid output end. The at least one first outlet pipe is thermally coupled to the at least one first outlet heat dissipating fin. A first inlet temperature of the liquid coolant at the first inlet fluid input end is greater than a first return temperature of the liquid coolant at the first outlet fluid input end. A pitch measurement of the first inlet fin pitch is greater than a pitch measurement of the first outlet fin pitch.

According to another aspect of the present disclosure, the at least one first inlet heat dissipating fin includes a plurality of first inlet heat dissipating fins. The at least one first outlet heat dissipating fin includes a plurality of first outlet heat dissipating fins. The pitch measurements of the first inlet fin pitch and the first outlet fin pitch are a pitch measurement between centerlines of two adjacent plurality of first inlet fins and a pitch measurement between centerlines of two adjacent plurality of first outlet heat dissipating fins, respectively.

According to another aspect of the present disclosure, a length of the at least one first inlet heat dissipating fin and a length of the at least one first outlet heat dissipating fin are the same lengths. A top first plane and a bottom first plane is defined by the lengths of the at least one first inlet heat dissipating fin of the first inlet radiator portion disposed adjacent to the at least one first outlet heat dissipating fin of the first outlet radiator portion.

According to another aspect of the present disclosure, a configuration of the at least one first inlet pipe is a flat pipe configuration and a configuration of the at least one first outlet pipe is a flat pipe configuration. A quantity of the at least one first inlet pipe is six and a quantity of the at least one first inlet pipe is five. The at least one first inlet pipe is between any two of the at least one first inlet heat dissipating fin. The at least one first outlet pipe is between any two of the at least one first outlet heat dissipating fin.

According to yet another aspect of the present disclosure, the water cooling radiator further includes a first dividing pipe. The first dividing pipe in fluid communication with the first return chamber via a first dividing fluid return end and in fluid communication with the outlet chamber via a first dividing fluid outlet end. The first dividing pipe is thermally coupled to the at least one first outlet heat dissipating fin on an outlet radiator portion base side and is thermally coupled to the at least one first inlet heat dissipating fin on an inlet radiator portion base side.

According to another aspect of the present disclosure, a surface geometry of the at least one first inlet heat dissipating fin is a wavy-rectangular surface geometry and a surface geometry of the at least one first outlet heat dissipating fin is a wavy-rectangular surface geometry. A quantity of the at least one first inlet heat dissipating fin is seven, and a quantity of the at least one first inlet heat dissipating fin is six.

According to another aspect of the present disclosure, the water cooling radiator further includes a pair of first side plates, one first side plate is disposed on a side of the first inlet radiator portion and another first side plate is disposed on a side of the first outlet radiator portion. Each of the pair of first side plates, is opposite each of the adjacent sides of the first inlet radiator portion and the first outlet radiator portion, respectively.

According to another aspect of the present disclosure, the water cooling radiator further includes an inlet nozzle and an outlet nozzle. The inlet nozzle is mounted to the inlet port and the outlet nozzle is mounted to the outlet port. The inlet nozzle and outlet nozzle are both configured for a liquid conduit to be mounted thereto, opposite the inlet port and outlet port, respectively. The inlet nozzle and outlet nozzle are both configured for liquid coolant to flow therethrough and to be in fluid communication with the inlet chamber and outlet chamber, respectively.

According to another aspect of the present disclosure, the at least one first inlet heat dissipating fin and the at least one first outlet heat dissipating fin are each made of thermally conductive materials, respectively.

According to another aspect of the present disclosure, the first liquid return tank further includes an inlet passthrough chamber, an outlet passthrough chamber, and a passthrough dividing panel and the water cooling radiator further includes a second radiator having a second radiator thickness. The inlet passthrough chamber is in fluid communication with the inlet chamber. The outlet passthrough chamber is in fluid communication with the outlet chamber. The passthrough dividing panel separates the inlet passthrough chamber from the outlet passthrough chamber. The second radiator is disposed adjacent to the first radiator and in fluid communication therewith. The second radiator includes a second liquid return tank, a second inlet radiator portion, and a second outlet radiator portion. The second liquid return tank defines a second return chamber. The second inlet radiator portion is disposed between the first liquid return tank and the second liquid return tank. The second inlet radiator portion includes at least one second inlet heat dissipating fin and at least one second inlet pipe, the at least one second inlet heat dissipating fin has a second inlet fin pitch. The at least one second inlet pipe in fluid communication with the inlet passthrough chamber via a second inlet fluid input end and in fluid communication with the second return chamber via a second inlet fluid output end. The at least one second inlet pipe is thermally coupled to the at least one second inlet heat dissipating fin. The second outlet radiator portion is disposed between the first liquid return tank and the second liquid return tank and adjacent to the second inlet radiator portion. The second outlet radiator portion includes at least one second outlet heat dissipating fin and at least one second outlet pipe. The at least one second outlet heat dissipating fin has a second outlet fin pitch. The at least one second outlet pipe in fluid communication with the second return chamber via a second outlet fluid input end and in fluid communication with the outlet passthrough chamber via a second outlet fluid output end. The at least one second outlet pipe is thermally coupled to the at least one second outlet heat dissipating fin. A second inlet temperature of the liquid coolant at the second inlet fluid input end is greater than a second return temperature of the liquid coolant at the second outlet fluid input end. A pitch measurement of the second inlet fin pitch is greater than a pitch measurement of the second outlet fin pitch.

According to yet another aspect of the present disclosure, the at least one second inlet heat dissipating fin includes a plurality of second inlet fins. The at least one second outlet heat dissipating fin includes a plurality of second outlet fins. The pitch measurements of the second inlet fin pitch and the second outlet fin pitch are a pitch measurement between centerlines of two adjacent plurality of second inlet fins and a pitch measurement between centerlines of two adjacent plurality of second outlet fins, respectively.

According to yet another aspect of the present disclosure, a length of the at least one second inlet heat dissipating fin and a length of the at least one second outlet heat dissipating fin are the same lengths. A top second plane and a bottom second plane is defined by the lengths of the at least one second inlet heat dissipating fin of the second inlet radiator portion disposed adjacent to the at least one second outlet heat dissipating fin of the second outlet radiator portion.

According to yet another aspect of the present disclosure, the length of the at least one second inlet heat dissipating fin and the at least one second outlet heat dissipating fin is greater than the length of the at least one first inlet heat dissipating fin and the at least one first outlet heat dissipating fin.

According to yet another aspect of the present disclosure, a configuration of the at least one second inlet pipe is a flat pipe configuration and a configuration of the at least one second outlet pipe is a flat pipe configuration. A quantity of the at least one second inlet pipe is six and a quantity of the at least one second inlet pipe is five. The at least one second inlet pipe is between any two of the at least one second inlet heat dissipating fin. The at least one second outlet pipe is between any two of the at least one second outlet heat dissipating fin.

According to further yet another aspect of the present disclosure, the water cooling radiator further includes a second dividing pipe, the second dividing pipe is in fluid communication with the second return chamber via a second dividing fluid return end and in fluid communication with the outlet passthrough chamber via a second dividing fluid outlet end. The second dividing pipe is thermally coupled to the at least one second outlet heat dissipating fin on an outlet radiator portion base side and is thermally coupled to the at least one second inlet heat dissipating fin on an inlet radiator portion base side.

According to yet another aspect of the present disclosure, a surface geometry of the at least one second inlet heat dissipating fin is a wavy-rectangular surface geometry and a surface geometry of the at least one second outlet heat dissipating fin is a wavy-rectangular surface geometry. A quantity of the at least one second inlet heat dissipating fin is seven, and a quantity of the at least one second inlet heat dissipating fin is six.

According to yet another aspect of the present disclosure, the water cooling radiator further includes a pair of second side plates. One second side plate is disposed on a side of the second inlet radiator portion and another second side plate is disposed on a side of the second outlet radiator portion. Each of the pair of second side plates are opposite each of the adjacent sides of the second inlet radiator portion and the second outlet radiator portion, respectively.

According to yet another aspect of the present disclosure, the at least one second inlet heat dissipating fin and the at least one second outlet heat dissipating fin are each made of thermally conductive materials, respectively.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

DETAILED DESCRIPTION

Embodiments described herein are directed to a water cooling radiator including an inlet radiator portion having inlet heat dissipating fins, each having an inlet fin pitch, and an outlet radiation portion having outlet heat dissipating fins, each having an outlet fin pitch. The water cooling radiator dissipates heat generated from heat generating sources, whereby a pitch measurement of the inlet fin pitch is greater than a pitch measurement of the outlet fin pitch, thereby increasing heat transfer efficiency. Heat generating sources, in addition to processing units (e.g., CPUs, GPUs, etc.), also include expansion cards, such as graphics cards, sound cards, video cards, network interface cards, wireless connection cards, etc.

Figure 1:
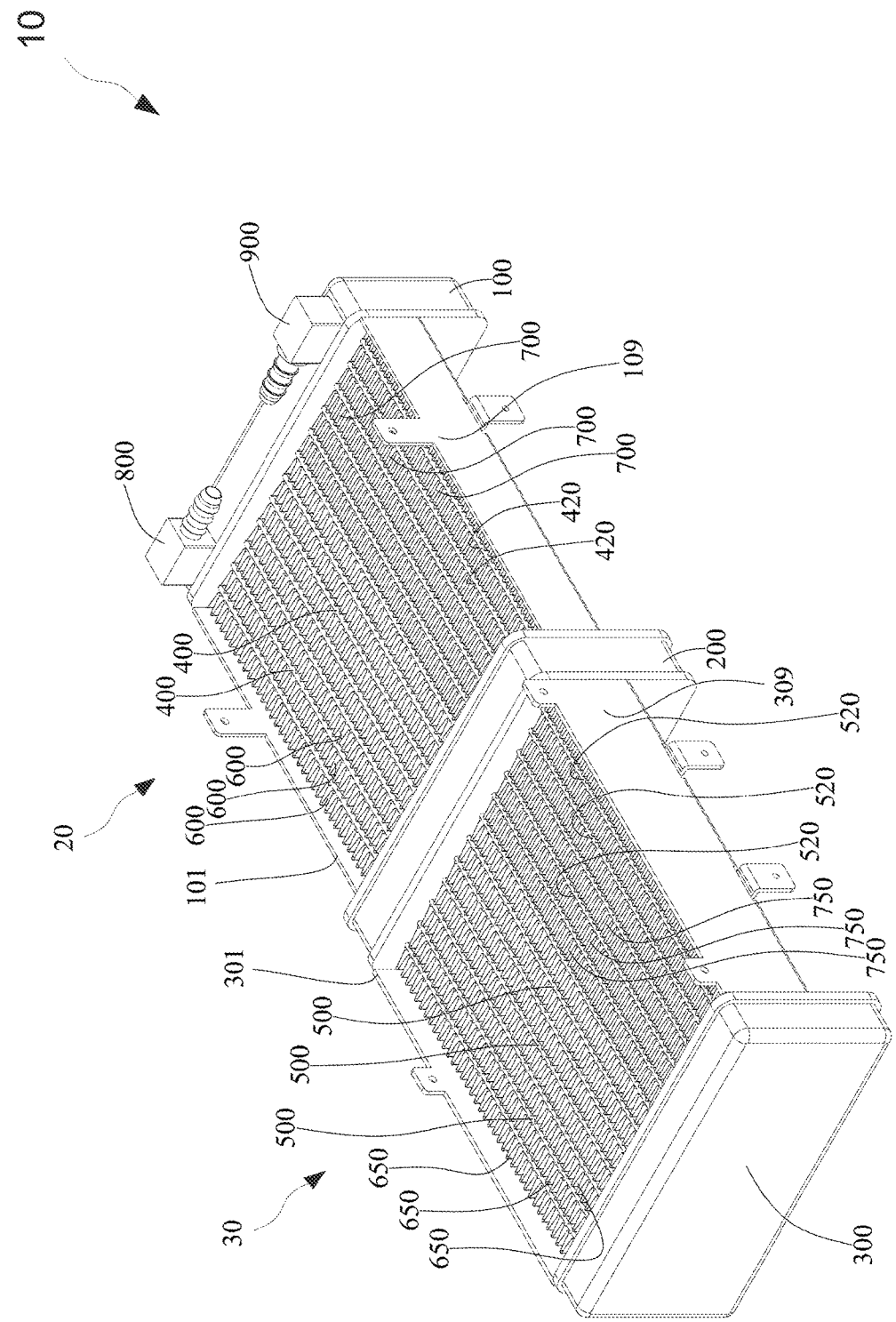
FIG. 1 is a perspective view of a water cooling radiator, according to embodiments of the disclosure.
Figure 2:
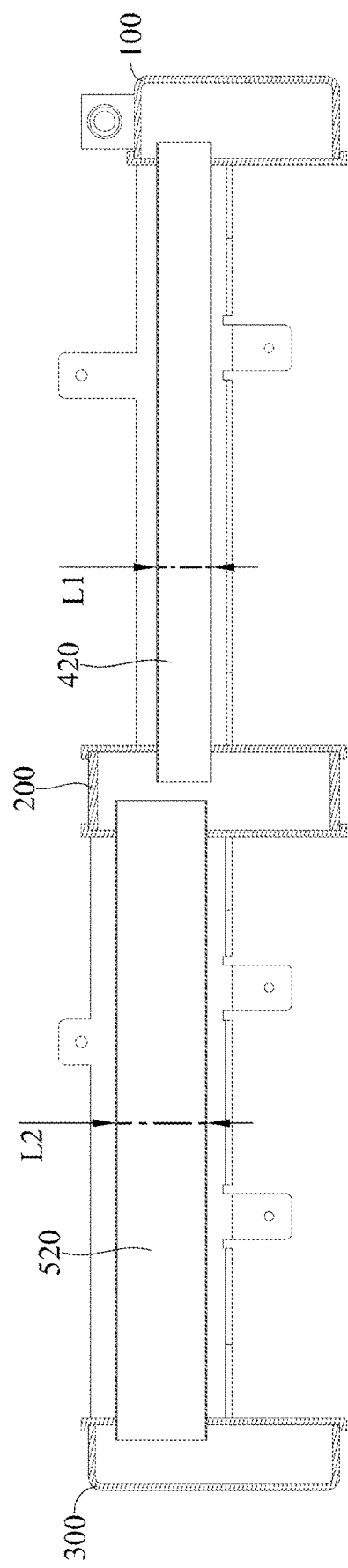
FIG. 2 is another cross-section view of the water cooling radiator of FIG. 1, according to embodiments of the disclosure.
Figure 3:
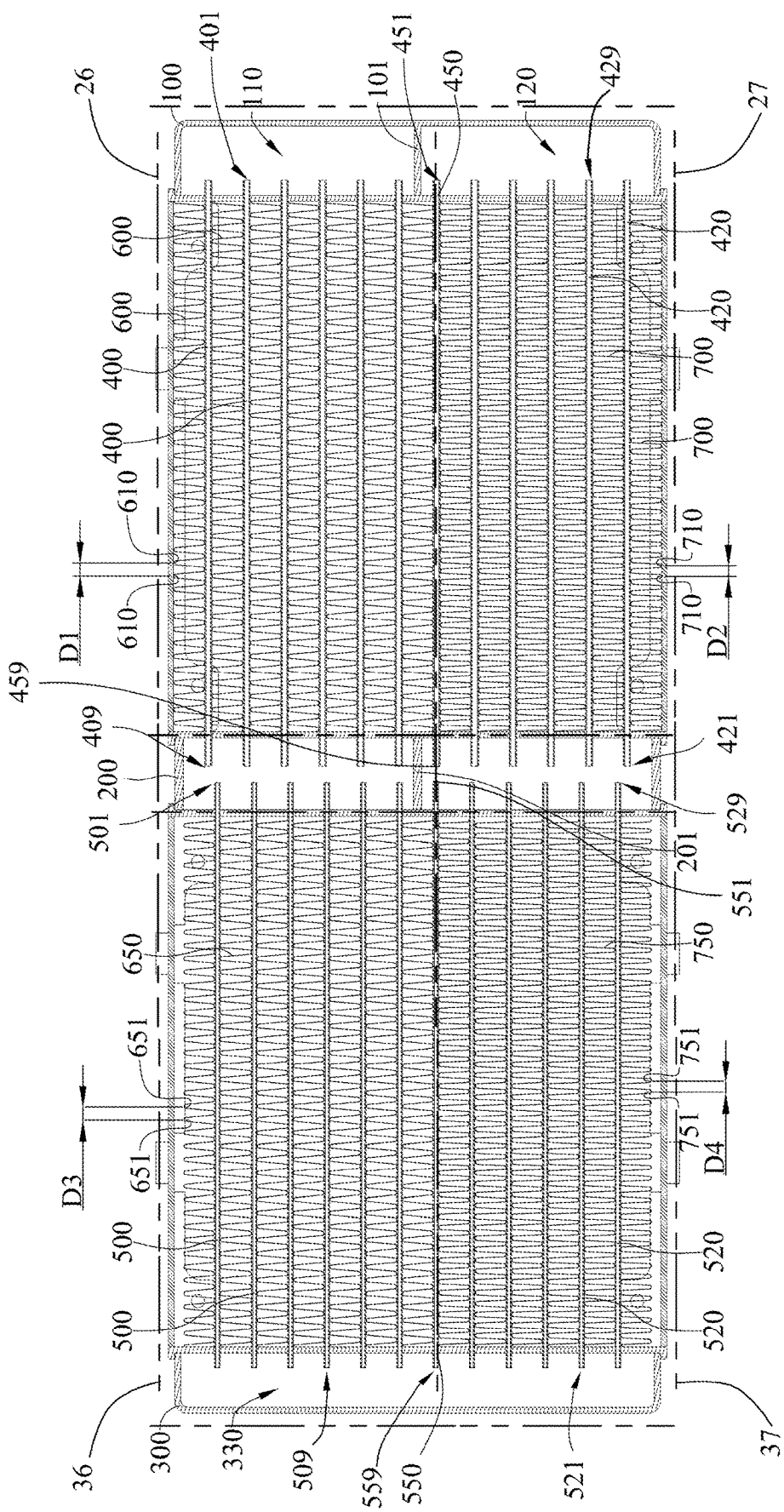
FIG. 3 is interior views of tanks of the water cooling radiator of FIG. 1, according to embodiments of the disclosure.
Figure 4:
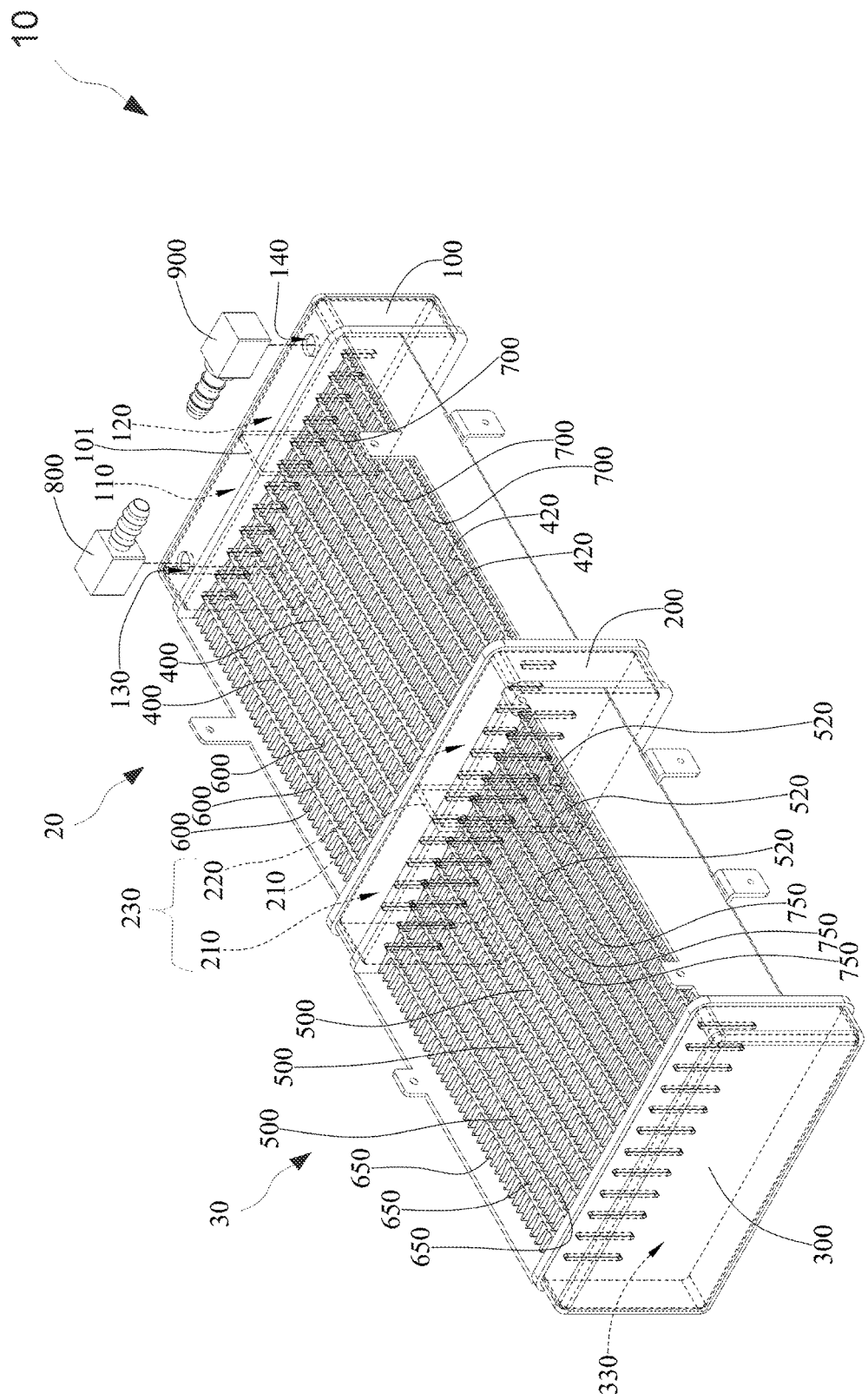
FIG. 4 is a cross-section view of the water cooling radiator of FIG. 1, according to embodiments of the disclosure.

FIG. 1 is a perspective view of a water cooling radiator 10, according to embodiments of the disclosure. FIG. 2 is another cross-section view of the water cooling radiator 10 of FIG. 1, according to embodiments of the disclosure. FIG. 3 is interior views of tanks of the water cooling radiator 10 of FIG. 1, according to embodiments of the disclosure. FIG. 4 is a cross-section view of the water cooling radiator 10 of FIG. 1, according to embodiments of the disclosure. As illustrated in FIGS. 1 to 4, a water cooling radiator 10, configured for liquid coolant to flow therethrough, includes a first radiator 20 having a first radiator 20 thickness H1. The first radiator 20 includes a liquid tank 100, a first liquid return tank 200, a first inlet radiator portion 26, and a first outlet radiator portion 27. The liquid tank 100 includes an inlet chamber 110, an outlet chamber 120, and a first dividing panel 101. The inlet chamber 110 has an inlet port 130 and the outlet chamber 120 has an outlet port 140. The first dividing panel 101 separates the inlet chamber 110 from the outlet chamber 120. The first liquid return tank 200 defines a first return chamber 230. The first inlet radiator portion 26 is disposed between the liquid tank 100 and the first liquid return tank 200. The first inlet radiator portion 26 includes at least one first inlet heat dissipating fin 600 and at least one first inlet pipe 400. The at least one first inlet heat dissipating fin 600 has a first inlet fin pitch D1. The at least one first inlet pipe 400 is in fluid communication with the inlet chamber 110 via a first inlet fluid input end 401 and in fluid communication with the first return chamber 230 via a first inlet fluid output end 409. The at least one first inlet pipe 400 is thermally coupled to the at least one first inlet heat dissipating fin 600. The first outlet radiator portion 27 is disposed between the liquid tank 100 and the first liquid return tank 200 and adjacent to the first inlet radiator portion 26. The first outlet radiator portion 27 includes at least one first outlet heat dissipating fin 700 and at least one first outlet pipe 420. The at least one first outlet heat dissipating fin 700 has a first outlet fin pitch D2. The at least one first outlet pipe 420 in fluid communication with the first return chamber 230 via a first outlet fluid input end 421 and in fluid communication with the outlet chamber 120 via a first outlet fluid output end 429. The at least one first outlet pipe 420 is thermally coupled to the at least one first outlet heat dissipating fin 700. A first inlet temperature of the liquid coolant at the first inlet fluid input end 401 is greater than a first return temperature of the liquid coolant at the first outlet fluid input end 421. A pitch measurement of the first inlet fin pitch D1 is greater than a pitch measurement of the first outlet fin pitch D2. Thus, for a low to moderate but equal air flow, heat transfer efficiency is maximized without sacrificing available space, cost budget, and a quieter system.

As illustrated, the at least one first inlet heat dissipating fin 600 includes a plurality of first inlet heat dissipating fins. The at least one first outlet heat dissipating fin 700 includes a plurality of first outlet heat dissipating fins. The pitch measurements of the first inlet fin pitch D1 and the first outlet fin pitch D2 are a pitch measurement between centerlines of two adjacent plurality of first inlet fins 610/610 and a pitch measurement between centerlines of two adjacent plurality of first outlet heat dissipating fins 710/710, respectively.

As illustrated, a length of the at least one first inlet heat dissipating fin 600 and a length of the at least one first outlet heat dissipating fin 700 are the same lengths L1/L1. A top first plane and a bottom first plane is defined by the lengths of the at least one first inlet heat dissipating fin 600 of the first inlet radiator portion 26 disposed adjacent to the at least one first outlet heat dissipating fin 700 of the first outlet radiator portion 27.

As illustrated, a configuration of the at least one first inlet pipe 400 is a flat pipe configuration and a configuration of the at least one first outlet pipe 420 is a flat pipe configuration. A quantity of the at least one first inlet pipe 400 is six and a quantity of the at least one first inlet pipe 400 is five. The at least one first inlet pipe 400 is between any two of the at least one first inlet heat dissipating fin 600. The at least one first outlet pipe 420 is between any two of the at least one first outlet heat dissipating fin 700.

As further yet illustrated, the water cooling radiator 10 further includes a first dividing pipe 450. The first dividing pipe 450 is in fluid communication with the first return chamber 230 via a first dividing fluid return end 459 and in fluid communication with the outlet chamber 120 via a first dividing fluid outlet end 451. The first dividing pipe 450 is thermally coupled to the at least one first outlet heat dissipating fin 700 on an outlet radiator portion base side and is thermally coupled to the at least one first inlet heat dissipating fin 600 on an inlet radiator portion base side.

As illustrated, a surface geometry of the at least one first inlet heat dissipating fin 600 is a wavy-rectangular surface geometry and a surface geometry of the at least one first outlet heat dissipating fin 700 is a wavy-rectangular surface geometry. A quantity of the at least one first inlet heat dissipating fin 600 is seven, and a quantity of the at least one first inlet heat dissipating fin 700 is six.

As illustrated, the water cooling radiator 10 further includes a pair of first side plates 101/109. One first side plate 101 is disposed on a side of the first inlet radiator portion 26 and another first side plate 109 is disposed on a side of the first outlet radiator portion 27. Each of the pair of first side plates 101/109, is opposite each of the adjacent sides of the first inlet radiator portion 26 and the first outlet radiator portion 27, respectively. Each of the pair of first side plates 101/109 is generally flat rectangular shaped and sized and configured to encompass a base side of the inlet radiator portion 26 and a base side of the outlet radiator portion 27, respectively.

As illustrated, the water cooling radiator 10 further includes an inlet nozzle 800 and an outlet nozzle 900. The inlet nozzle 800 is mounted to the inlet port 130 and the outlet nozzle 900 is mounted to the outlet port 140. The inlet nozzle 800 and outlet nozzle 900 are both configured for a liquid conduit (not shown) to be mounted thereto, opposite the inlet port 130 and outlet port 140, respectively. The direction of mounting of each of the liquid conduits (not shown) is from a side having the opposing inlet nozzle 800 and outlet nozzle 900, respectively, whereby, a periphery of the water coiling radiator 10 from a top view is minimized. The inlet nozzle 800 and outlet nozzle 900 are both configured for liquid coolant to flow therethrough and to be in fluid communication with the inlet chamber 110 and outlet chamber, respectively.

As illustrated, the first liquid return tank 200 further includes an inlet passthrough chamber 210, an outlet passthrough chamber 220, and a passthrough dividing panel 201 and the water cooling radiator 10 further includes a second radiator 30 having a second radiator 30 thickness H2. The inlet passthrough chamber 210 is in fluid communication with the inlet chamber 110. The outlet passthrough chamber 220 is in fluid communication with the outlet chamber 120. The passthrough dividing panel 201 separates the inlet passthrough chamber 210 from the outlet passthrough chamber 220. The second radiator 30 is disposed adjacent to the first radiator 20 and in fluid communication therewith. The second radiator 30 includes a second liquid return tank 300, a second inlet radiator portion 36, and a second outlet radiator portion 37. The second liquid return tank 300 defines a second return chamber 330. The second inlet radiator portion 36 is disposed between the first liquid return tank 200 and the second liquid return tank 300. The second inlet radiator portion 36 includes at least one second inlet heat dissipating fin 650 and at least one second inlet pipe 500, the at least one second inlet heat dissipating fin 650 has a second inlet fin pitch D3. The at least one second inlet pipe 500 in fluid communication with the inlet passthrough chamber 210 via a second inlet fluid input end 501 and in fluid communication with the second return chamber 330 via a second inlet fluid output end 509. The at least one second inlet pipe 500 is thermally coupled to the at least one second inlet heat dissipating fin 650. The second outlet radiator portion 37 is disposed between the first liquid return tank 200 and the second liquid return tank 300 and adjacent to the second inlet radiator portion 36. The second outlet radiator portion 37 includes at least one second outlet heat dissipating fin 750 and at least one second outlet pipe 520. The at least one second outlet heat dissipating fin 750 has a second outlet fin pitch D4. The at least one second outlet pipe 520 is in fluid communication with the second return chamber 330 via a second outlet fluid input end 521 and in fluid communication with the outlet passthrough chamber 220 via a second outlet fluid output end 529. The at least one second outlet pipe 520 is thermally coupled to the at least one second outlet heat dissipating fin 750. A second inlet temperature of the liquid coolant at the second inlet fluid input end 501 is greater than a second return temperature of the liquid coolant at the second outlet fluid input end 521. A pitch measurement of the second inlet fin pitch D3 is greater than a pitch measurement of the second outlet fin pitch D4. Thus, for a low to moderate but equal air flow, heat transfer efficiency is maximized without sacrificing cost budget, and a quieter system. Additionally, two or more different sized thickness radiators may be combined to further increase total heat transfer efficiency.

As further illustrated, the at least one second inlet heat dissipating fin 650 includes a plurality of second inlet fins. The at least one second outlet heat dissipating fin 750 includes a plurality of second outlet fins. The pitch measurements of the second inlet fin pitch D3 and the second outlet fin pitch D4 are a pitch measurement between centerlines of two adjacent plurality of second inlet fins 651/651 and a pitch measurement between centerlines of two adjacent plurality of second outlet fins 751/751, respectively.

As further illustrated, a length of the at least one second inlet heat dissipating fin 650 and a length of the at least one second outlet heat dissipating fin 750 are the same lengths L2/L2. A top second plane and a bottom second plane is defined by the lengths of the at least one second inlet heat dissipating fin 650 of the second inlet radiator portion 36 disposed adjacent to the at least one second outlet heat dissipating fin 750 of the second outlet radiator portion 37.

As further illustrated, the length L2 of the at least one second inlet heat dissipating fin 650 and the at least one second outlet heat dissipating fin 750 is greater than the length L1 of the at least one first inlet heat dissipating fin 600 and the at least one first outlet heat dissipating fin 700; however, the embodiments are not limited thereto. The length L2 of the at least one second inlet heat dissipating fin 650 and the at least one second outlet heat dissipating fin 750 may be lesser than the length L1 of the at least one first inlet heat dissipating fin 600 and the at least one first outlet heat dissipating fin 700. As long as the length L2 of the at least one second inlet heat dissipating fin 650 and the at least one second outlet heat dissipating fin 750 is different from the length L1 of the at least one first inlet heat dissipating fin 600 and the at least one first outlet heat dissipating fin 700, and a total fin surface area of the at least one second inlet heat dissipating fin 650 and the at least one second outlet heat dissipating fin 750 is different from a total fin surface area of the at least one first inlet heat dissipating fin 600 and the at least one first outlet heat dissipating fin 700, whereby the at least one heat dissipating fin having the larger total fin surface area has increased cooling efficiency without increasing of a width thereof. Thus, two different sized thickness radiators are combined to further increase total heat transfer efficiency.

As further illustrated, a configuration of the at least one second inlet pipe 500 is a flat pipe configuration and a configuration of the at least one second outlet pipe 520 is a flat pipe configuration. A quantity of the at least one second inlet pipe 500 is six and a quantity of the at least one second inlet pipe 500 is five. The at least one second inlet pipe 500 is between any two of the at least one second inlet heat dissipating fin 650. The at least one second outlet pipe 520 is between any two of the at least one second outlet heat dissipating fin 750.

As further yet illustrated, the water cooling radiator 10 further includes a second dividing pipe 550, the second dividing pipe 550 is in fluid communication with the second return chamber 330 via a second dividing fluid return end and in fluid communication with the outlet passthrough chamber 220 via a second dividing fluid outlet end. The second dividing pipe 550 is thermally coupled to the at least one second outlet heat dissipating fin 750 on an outlet radiator portion base side and is thermally coupled to the at least one second inlet heat dissipating fin 650 on an inlet radiator portion base side.

As further illustrated, a surface geometry of the at least one second inlet heat dissipating fin is a wavy-rectangular surface geometry and a surface geometry of the at least one second outlet heat dissipating fin is a wavy-rectangular surface geometry. A quantity of the at least one second inlet heat dissipating fin is seven, and a quantity of the at least one second inlet heat dissipating fin is six.

As further illustrated, the water cooling radiator 10 further includes a pair of second side plates 301/309. One second side plate 301 is disposed on a side of the second inlet radiator portion 36 and another second side plate 309 is disposed on a side of the second outlet radiator portion 37. Each of the pair of second side plates 301/309 are opposite each of the adjacent sides of the second inlet radiator portion 36 and the second outlet radiator portion 37, respectively. Each of the pair of first side plates 101/109 is generally flat rectangular shaped and sized and configured to encompass a base side of the inlet radiator portion 36 and a base side of the outlet radiator portion 37, respectively.

As illustrated, the surface geometry of the at least one first inlet heat dissipating fin 600, the at least one first outlet heat dissipating fin 700, the at least one second inlet heat dissipating fin 650, and the at least one second outlet heat dissipating fin 750 is a wavy-rectangular surface geometry; however, the embodiments are not limited thereto. The surface geometry of the at least one first inlet heat dissipating fin 600, the at least one first outlet heat dissipating fin 700, the at least one second inlet heat dissipating fin 650, and the at least one second outlet heat dissipating fin 750 may be rectangular shaped. As long as the heat transfer surface per cubic meter of volume of the heat dissipating fins having the greater inlet temperature of the liquid coolant at the fluid input end is smaller than the heat transfer surface per cubic meter of volume of the heat dissipating fins having the lower return temperature of the liquid coolant at the fluid input end.

Surface geometry heat transfer augmentations known by those skilled in the art, as examples, include fin surface perforations resulting in wake mixing, wavy fins yielding secondary flows, and the repeated growth of laminar boundary layers followed by dissipation in the wake regions of offset-strip fins, louvered fins, and pin fins.

In the illustrated embodiments, although the first inlet radiator portion 26, the first outlet radiator portion 27, the second inlet radiator portion 36, the second outlet radiator portion 37, and the water cooling radiator 10 illustrated in FIGS. 1, 3, and 4 are generally rectangular in shape, the first inlet radiator portion 26, the first outlet radiator portion 27, the second inlet radiator portion 36, the second outlet radiator portion 37, and the water cooling radiator 10 are not limited to having any particular shape, and may be of any desired shape and size, based on, for instance, application, design and/or the number and size of the heat generating sources. Sizes and thicknesses of the water cooling radiator 10 known by those skilled in the art, as examples, include 120 mm/30 mm, 120 mm/45 mm, 140 mm/30 mm, 240 mm/45 mm, 280 mm/45 mm, 360 mm/45 mm, 420 mm/30 mm etc.

In the illustrated embodiments, the at least one first inlet pipe 400, the at least one first outlet pipe 420, the at least one first inlet pipe 500, and the at least one first outlet pipe 520, are in fluid communication with the inlet chamber 110 and the first return chamber 230, the first return chamber 230 and the outlet chamber 120, the inlet passthrough chamber 210 and the second return chamber 330, and the second return chamber 330 and the outlet passthrough chamber 220, respectively, via mounting. As an example, the mounting method may include welding; however, the embodiments are not limited thereto. Other mounting methods known by those skilled in the art, as examples, may include utilizing adhesives, fasteners, screws etc. As long as the at least one first inlet pipe 400, the at least one first outlet pipe 420, the at least one first inlet pipe 500, and the at least one first outlet pipe 520, are in fluid communication with the inlet chamber 110 and the first return chamber 230, the first return chamber 230 and the outlet chamber 120, the inlet passthrough chamber 210 and the second return chamber 330, and the second return chamber 220, respectively.

In the illustrated embodiments, the at least one first inlet heat dissipating fin 600, the at least one first outlet heat dissipating fin 700, the at least one second inlet heat dissipating fin 650, and the at least one second outlet heat dissipating fin 750, are each integrally sized and shaped (or otherwise configured), respectively; however, the embodiments are not limited thereto. The at least one first inlet heat dissipating fin 600, the at least one first outlet heat dissipating fin 700, the at least one second inlet heat dissipating fin 650, and the at least one second outlet heat dissipating fin 750, may each not be integrally sized and shaped (or otherwise configured), respectively. As long as the at least one first inlet pipe 400 is thermally coupled to the at least one first inlet heat dissipating fin 600, the at least one first outlet pipe 420 is thermally coupled to the at least one first outlet heat dissipating fin 700, the at least one second inlet pipe 500 is thermally coupled to the at least one second inlet heat dissipating fin 650, the at least one second outlet pipe 520 is thermally coupled to the at least one second outlet heat dissipating fin 750, the first dividing pipe 450 is thermally coupled to the at least one first outlet heat dissipating fin 700 on an outlet radiator portion base side and is thermally coupled to the at least one first inlet heat dissipating fin 600 on an inlet radiator portion base side, and the second dividing pipe 550 is thermally coupled to the at least one second outlet heat dissipating fin 750 on an outlet radiator portion base side and is thermally coupled to the at least one second inlet heat dissipating fin 650 on an inlet radiator portion base side. Thermal coupling methods of the heat dissipating fins to the at least one pipe and the dividing pipe known by those skilled in the art, as examples, include welding and soldering etc.

In the illustrated embodiments, the pitch measurement of the first inlet fin pitch D1 is greater than the pitch measurement of the first outlet fin pitch D2 and the pitch measurement of the second inlet fin pitch D3 is greater than the pitch measurement of the second outlet fin pitch D4. As an example, the first inlet fin pitch D1 and the second inlet fin pitch D3 may be 3.2 millimeters and the first outlet fin pitch D3 and the second outlet fin pitch D4 may be 2.5 millimeters; however, the embodiments are not limited thereto. As further examples, the first inlet fin pitch D1 and the second inlet fin pitch D3 may be 3.6 millimeters and the first outlet fin pitch D3 and the second outlet fin pitch D4 may be 2.6 millimeters or the first inlet fin pitch D1 and the second inlet fin pitch D3 may be 3.6 millimeters and the first outlet fin pitch D3 and the second outlet fin pitch D4 may be 2.3 millimeters or the first inlet fin pitch D1 and the second inlet fin pitch D3 may be 2.8 millimeters and the first outlet fin pitch D3 and the second outlet fin pitch D4 may be 2.3 millimeters or the first inlet fin pitch D1 and the second inlet fin pitch D3 may be 2.8 millimeters and the first outlet fin pitch D3 and the second outlet fin pitch D4 may be 2.6 millimeters. As long as the pitch measurement of the inlet fin pitch is greater than the pitch measurement of the outlet fin pitch, whereby the total fin surface area of the at least one inlet heat dissipating fin having the inlet fin pitch is smaller than the total fin surface area of the at least one outlet heat dissipating fin having the outlet fin pitch, and the inlet temperature of the liquid coolant at the inlet fluid input end of the at least one inlet pipe is greater than the return temperature of the liquid coolant at the outlet fluid input end of the at least one outlet pipe.

In the illustrated embodiments, the at least one first inlet heat dissipating fin 600, the at least one first outlet heat dissipating fin 700, the at least one second inlet heat dissipating fin 650, and the at least one second outlet heat dissipating fin 750 are each made of thermally conductive materials, respectively. In the illustrated embodiments, the at least one first inlet pipe 400, the at least one first outlet pipe 420, the at least one second inlet pipe 500, and the at least one second outlet pipe 520 are each made of thermally conductive materials, respectively. Examples of thermally conductive materials include gold, copper, silver etc.

The embodiments of the water cooling radiator 10 maximize heat transfer efficiency without sacrificing cost budget, and a quieter system, for increased cooling capacity. With the pitch measurement of the first inlet fin pitch D1 being greater than a pitch measurement of the first outlet fin pitch D2, for a low to moderate but equal air flow, heat transfer efficiency is maximized. If the pitch measurement of the water cooling radiator 10 is the pitch measurement of the first outlet fin pitch D2 (higher density), greater air flow would be required, increasing costs and noise of a fan; otherwise, heat transfer efficiency would decrease. If the pitch measurement of the water cooling radiator 10 is the pitch measurement of the first inlet fin pitch D2 (lower density), a higher heat transfer efficiency would be sacrificed. With the pitch measurement of the second inlet fin pitch D2 being greater than a pitch measurement of the second outlet fin pitch D2, for a low to moderate but equal air flow, heat transfer efficiency is maximized. If the pitch measurement of the water cooling radiator 10 is the pitch measurement of the second outlet fin pitch D2 (higher density), greater air flow would be required, increasing costs and noise of a fan; otherwise, heat transfer efficiency would decrease. If the pitch measurement of the water cooling radiator 10 is the pitch measurement of the second inlet fin pitch D2 (lower density), a higher heat transfer efficiency would be sacrificed. Moreover, two or more different sized thickness radiators may be combined to further increase total heat transfer efficiency.

Therefore, embodiments disclosed herein are well adapted to attain the ends and advantages mentioned as well as those that are inherent therein. The particular embodiments disclosed above are illustrative only, as the embodiments disclosed may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the elements that it introduces.

What is claimed is:

1. A water cooling radiator, configured for liquid coolant to flow therethrough, comprising:
    a first radiator having a first radiator thickness, comprising:
        a liquid tank including an inlet chamber, an outlet chamber, and a first dividing panel, the inlet chamber having an inlet port, the outlet chamber having an outlet port, and the first dividing panel separating the inlet chamber from the outlet chamber;
        a first liquid return tank defining a first return chamber;
        a first inlet radiator portion disposed between the liquid tank and the first liquid return tank, the first inlet radiator portion including at least one first inlet heat dissipating fin and at least one first inlet pipe, the at least one first inlet heat dissipating fin having a first inlet fin pitch, the at least one first inlet pipe in fluid communication with the inlet chamber via a first inlet fluid input end and in fluid communication with the first return chamber via a first inlet fluid output end, wherein the at least one first inlet pipe is thermally coupled to the at least one first inlet heat dissipating fin; and
        a first outlet radiator portion disposed between the liquid tank and the first liquid return tank and adjacent to the first inlet radiator portion, the first outlet radiator portion including at least one first outlet heat dissipating fin and at least one first outlet pipe, the at least one first outlet heat dissipating fin having a first outlet fin pitch, the at least one first outlet pipe in fluid communication with the first return chamber via a first outlet fluid input end and in fluid communication with the outlet chamber via a first outlet fluid output end, wherein the at least one first outlet pipe is thermally coupled to the at least one first outlet heat dissipating fin; and
    wherein a first inlet temperature of the liquid coolant at the first inlet fluid input end is greater than a first return temperature of the liquid coolant at the first outlet fluid input end, and wherein a pitch measurement of the first inlet fin pitch is greater than a pitch measurement of the first outlet fin pitch.

2. The water cooling radiator of claim 1, wherein the at least one first inlet heat dissipating fin includes a plurality of first inlet heat dissipating fins, and the at least one first outlet heat dissipating fin includes a plurality of first outlet heat dissipating fins, and wherein pitch measurements of the first inlet fin pitch and the first outlet fin pitch are a pitch measurement between centerlines of two adjacent plurality of first inlet fins and a pitch measurement between centerlines of two adjacent plurality of first outlet heat dissipating fins, respectively.

3. The water cooling radiator of claim 1, wherein a length of the at least one first inlet heat dissipating fin and a length of the at least one first outlet heat dissipating fin are the same lengths, and a top first plane and a bottom first plane is defined by the lengths of the at least one first inlet heat dissipating fin of the first inlet radiator portion disposed adjacent to the at least one first outlet heat dissipating fin of the first outlet radiator portion.

4. The water cooling radiator of claim 1, wherein a configuration of the at least one first inlet pipe is a flat pipe configuration, a configuration of the at least one first outlet pipe is a flat pipe configuration, a quantity of the at least one first inlet pipe is six, and a quantity of the at least one first inlet pipe is five, and the at least one first inlet pipe is between any two of the at least one first inlet heat dissipating fin and the at least one first outlet heat dissipating fin is between any two of the at least one first outlet heat dissipating fin.

5. The water cooling radiator of claim 4, further comprising a first dividing pipe, the first dividing pipe in fluid communication with the first return chamber via a first dividing fluid return end and in fluid communication with the outlet chamber via a first dividing fluid outlet end, wherein the first dividing pipe is thermally coupled to the at least one first outlet heat dissipating fin on an outlet radiator portion base side and is thermally coupled to the at least one first inlet heat dissipating fin on an inlet radiator portion base side.

6. The water cooling radiator of claim 1, wherein a surface geometry of the at least one first inlet heat dissipating fin is a wavy-rectangular surface geometry, a surface geometry of the at least one first outlet heat dissipating fin is a wavy-rectangular surface geometry, a quantity of the at least one first inlet heat dissipating fin is seven, and a quantity of the at least one first inlet heat dissipating fin is six.

7. The water cooling radiator of claim 1, further comprising a pair of first side plates, one first side plate disposed on a side of the first inlet radiator portion and another first side plate disposed on a side of the first outlet radiator portion, each of the pair of first side plates opposite each of the adjacent sides of the first inlet radiator portion and the first outlet radiator portion, respectively.

8. The water cooling radiator of claim 1, further comprising an inlet nozzle and an outlet nozzle, the inlet nozzle mounted to the inlet port and the outlet nozzle mounted to the outlet port, the inlet nozzle and outlet nozzle, both configured for a liquid conduit to be mounted thereto, opposite the inlet port and outlet port, respectively, and both configured for liquid coolant to flow therethrough and to be in fluid communication with the inlet chamber and outlet chamber, respectively.

9. The water cooling radiator of claim 1, wherein the at least one first inlet heat dissipating fin and the at least one first outlet heat dissipating fin are each made of thermally conductive materials, respectively.

10. The water cooling radiator of claim 3,
wherein the first liquid return tank further includes an inlet passthrough chamber, an outlet passthrough chamber, and a passthrough dividing panel, the inlet passthrough chamber in fluid communication with the inlet chamber, the outlet passthrough chamber in fluid communication with the outlet chamber, the passthrough dividing panel separating the inlet passthrough chamber from the outlet passthrough chamber, the water cooling radiator further comprising:
a second radiator having a second radiator thickness, disposed adjacent to the first radiator and in fluid communication therewith, comprising:
a second liquid return tank defining a second return chamber;
a second inlet radiator portion disposed between the first liquid return tank and the second liquid return tank, the second inlet radiator portion including at least one second inlet heat dissipating fin and at least one second inlet pipe, the at least one second inlet heat dissipating fin having a second inlet fin pitch, the at least one second inlet pipe in fluid communication with the inlet passthrough chamber via a second inlet fluid input end and in fluid communication with the second return chamber via a second inlet fluid output end, wherein the at least one second inlet pipe is thermally coupled to the at least one second inlet heat dissipating fin; and
a second outlet radiator portion disposed between the first liquid return tank and the second liquid return tank and adjacent to the second inlet radiator portion, the second outlet radiator portion including at least one second outlet heat dissipating fin and at least one second outlet pipe, the at least one second outlet heat dissipating fin having a second outlet fin pitch, the at least one second outlet pipe in fluid communication with the second return chamber via a second outlet fluid input end and in fluid communication with the outlet passthrough chamber via a second outlet fluid output end, wherein the at least one second outlet pipe is thermally coupled to the at least one second outlet heat dissipating fin; and
wherein a second inlet temperature of the liquid coolant at the second inlet fluid input end is greater than a second return temperature of the liquid coolant at the second outlet fluid input end, and
wherein a pitch measurement of the second inlet fin pitch is greater than a pitch measurement of the second outlet fin pitch.

11. The water cooling radiator of claim 10, wherein the at least one second inlet heat dissipating fin includes a plurality of second inlet fins, and the at least one second outlet heat dissipating fin includes a plurality of second outlet fins, and wherein pitch measurements of the second inlet fin pitch and the second outlet fin pitch are a pitch measurement between centerlines of two adjacent plurality of second inlet fins and a pitch measurement between centerlines of two adjacent plurality of second outlet fins, respectively.

12. The water cooling radiator of claim 10, wherein a length of the at least one second inlet heat dissipating fin and a length of the at least one second outlet heat dissipating fin are the same lengths, and a top second plane and a bottom second plane is defined by the lengths of the at least one second inlet heat dissipating fin of the second inlet radiator portion disposed adjacent to the at least one second outlet heat dissipating fin of the second outlet radiator portion.

13. The water cooling radiator of claim 12, wherein the length of the at least one second inlet heat dissipating fin and the at least one second outlet heat dissipating fin is greater than the length of the at least one first inlet heat dissipating fin and the at least one first outlet heat dissipating fin.

14. The water cooling radiator of claim 10, wherein a configuration of the at least one second inlet pipe is a flat pipe configuration, a configuration of the at least one second outlet pipe is a flat pipe configuration, a quantity of the at least one second inlet pipe is six, and a quantity of the at least one second inlet pipe is five, and the at least one second inlet pipe is between any two of the at least one second inlet heat dissipating fin and the at least one second outlet heat dissipating fin is between any two of the at least one second outlet heat dissipating fin.

15. The water cooling radiator of claim 14, further comprising a second dividing pipe, the second dividing pipe in fluid communication with the second return chamber via a second dividing fluid return end and in fluid communication with the outlet passthrough chamber via a second dividing fluid outlet end, wherein the second dividing pipe is thermally coupled to the at least one second outlet heat dissipating fin on an outlet radiator portion base side and is thermally coupled to the at least one second inlet heat dissipating fin on an inlet radiator portion base side.

16. The water cooling radiator of claim 10, wherein a surface geometry of the at least one second inlet heat dissipating fin is a wavy-rectangular surface geometry, a surface geometry of the at least one second outlet heat dissipating fin is a wavy-rectangular surface geometry, a quantity of the at least one second inlet heat dissipating fin is seven, and a quantity of the at least one second inlet heat dissipating fin is six.

17. The water cooling radiator of claim 10, further comprising a pair of second side plates, one second side plate disposed on a side of the second inlet radiator portion and another second side plate disposed on a side of the second outlet radiator portion, each of the pair of second side plates opposite each of the adjacent sides of the second inlet radiator portion and the second outlet radiator portion, respectively.

18. The water cooling radiator of claim 10, wherein the at least one second inlet heat dissipating fin and the at least one second outlet heat dissipating fin are each made of thermally conductive materials, respectively.

* * * * *